(12) United States Patent
Knowles et al.

(10) Patent No.: US 7,144,624 B2
(45) Date of Patent: *Dec. 5, 2006

(54) DENDRITIC FIBER MATERIAL

(75) Inventors: Timothy R. Knowles, Del Mar, CA (US); Christopher L. Seaman, San Diego, CA (US)

(73) Assignee: Energy Science Laboratories, Inc., San Diego, CA (US)

( * ) Notice: Subject to any disclaimer, the term of this patent is extended or adjusted under 35 U.S.C. 154(b) by 702 days.

This patent is subject to a terminal disclaimer.

(21) Appl. No.: 10/072,424

(22) Filed: Feb. 8, 2002

(65) Prior Publication Data

US 2002/0100581 A1    Aug. 1, 2002

Related U.S. Application Data

(63) Continuation of application No. 09/593,587, filed on Jun. 13, 2000, now Pat. No. 6,913,075.

(60) Provisional application No. 60/139,443, filed on Jun. 14, 1999.

(51) Int. Cl.
  *B32B 1/00* (2006.01)
  *B32B 3/00* (2006.01)

(52) U.S. Cl. ............... 428/364; 428/376; 428/401; 977/734; 977/742; 165/185

(58) Field of Classification Search ............ 442/330, 442/334, 338, 340, 349; 428/99, 100, 102, 428/364, 378, 379–401; 385/78–80; 165/185
See application file for complete search history.

(56) References Cited

U.S. PATENT DOCUMENTS

| | | | |
|---|---|---|---|
| 2,542,637 A | 2/1951 | De Poy et al. | 148/15 |
| 3,294,880 A | 12/1966 | Turkat | 264/29 |
| 3,375,308 A | 3/1968 | Turkat | 284/29 |
| 3,531,249 A | 9/1970 | Turkat | 23/209.2 |
| 3,543,842 A | 12/1970 | Marges | 165/82 |
| 3,609,992 A | 10/1971 | Cacheux | 62/514 |
| 3,969,754 A | 7/1976 | Huniya et al. | 357/65 |
| 4,161,747 A | 7/1979 | Jennings | 357/82 |
| 4,318,954 A | 3/1982 | Jensen | 428/209 |
| 4,414,142 A | 11/1983 | Vogel et al. | 252/506 |
| 4,415,025 A | 11/1983 | Horvath | 165/185 |
| 4,424,145 A | 1/1984 | Sara | 252/509 |
| 4,435,375 A | 3/1984 | Tamura et al. | 423/439 |
| 4,470,063 A | 9/1984 | Arakawa et al. | 357/67 |
| 4,482,912 A | 11/1984 | Chiba et al. | 357/67 |
| 4,485,429 A | 11/1984 | Mittal | 361/386 |
| 4,591,659 A | 5/1986 | Leibowitz | 174/68.5 |
| 4,630,174 A | 12/1986 | Kaufman | 361/388 |
| 4,749,514 A | 6/1988 | Murakami et al. | 252/500 |
| 4,816,289 A | 3/1989 | Komatsu et al. | 423/447.3 |
| 4,849,858 A | 7/1989 | Grapes et al. | 361/388 |

(Continued)

OTHER PUBLICATIONS

Chung, D. D. L, Carbon Fiber Composites, 1994, Elsevier, pp. 3-11.*

(Continued)

*Primary Examiner*—Norca Torres
*Assistant Examiner*—Matthew Matzek
(74) *Attorney, Agent, or Firm*—Knobbe Martens Olson & Bear LLP (57) ABSTRACT

A thermal interface includes nanofibrils. The nanofibrils may be attached to a flat base or membrane, or may be attached to the tip portions of larger diameter fibers. The nanofibrils have a diameter of less than about 1 micron, and may advantageously be formed from single walled and/or multi-walled nanotubes.

13 Claims, 7 Drawing Sheets

U.S. PATENT DOCUMENTS

| | | | |
|---|---|---|---|
| 4,867,235 A | 9/1989 | Grapes et al. | 165/185 |
| 4,878,152 A | 10/1989 | Sauzade et al. | 361/386 |
| 4,933,804 A | 6/1990 | Bertenshaw et al. | 361/111 |
| 4,966,226 A | 10/1990 | Hamburgen | 165/104.26 |
| 4,985,805 A | 1/1991 | Riedel et al. | 361/386 |
| 5,014,161 A | 5/1991 | Lee et al. | 361/388 |
| 5,077,637 A | 12/1991 | Martorana et al. | 361/386 |
| 5,111,359 A | 5/1992 | Montesano | 361/388 |
| 5,150,748 A | 9/1992 | Blackmon et al. | 165/41 |
| 5,212,625 A | 5/1993 | van Andel et al. | 361/383 |
| 5,224,030 A | 6/1993 | Banks et al. | 361/386 |
| 5,260,124 A | 11/1993 | Gaier | 428/257 |
| 5,287,248 A | 2/1994 | Montesano | 361/708 |
| 5,316,080 A | 5/1994 | Banks et al. | 165/185 |
| 5,323,294 A | 6/1994 | Layton et al. | 361/699 |
| 5,389,400 A | 2/1995 | Ting et al. | 427/249 |
| 5,402,004 A | 3/1995 | Ozmat | 357/717 |
| 5,424,054 A | 6/1995 | Bethune et al. | 423/447.2 |
| 5,424,916 A | 6/1995 | Martin | 361/698 |
| 5,482,601 A | 1/1996 | Ohshima et al. | 204/173 |
| 5,494,753 A | 2/1996 | Anthony | 428/408 |
| 5,520,976 A | 5/1996 | Giannetti et al. | 428/36.3 |
| 5,523,260 A | 6/1996 | Missele | 437/209 |
| 5,542,471 A | 8/1996 | Dickinson | 165/170 |
| 5,566,752 A | 10/1996 | Arnold et al. | 165/185 |
| 5,591,312 A | 1/1997 | Smalley | 204/157.41 |
| 5,604,037 A | 2/1997 | Ting et al. | 428/408 |
| 5,608,267 A | 3/1997 | Mahulikar et al. | 257/796 |
| 5,698,175 A | 12/1997 | Hiura et al. | 423/447.1 |
| 5,753,088 A | 5/1998 | Olk | 204/173 |
| 5,805,424 A | 9/1998 | Purinton | 361/760 |
| 5,814,290 A | 9/1998 | Niu et al. | 423/344 |
| 5,830,326 A | 11/1998 | Iijima | 204/173 |
| 5,849,130 A | 12/1998 | Browne | |
| 6,054,198 A | 4/2000 | Bunyan et al. | |
| 6,063,243 A | 5/2000 | Zettl et al. | 204/164 |
| 6,143,445 A * | 11/2000 | Ferment et al. | 429/218.1 |
| 6,156,256 A | 12/2000 | Kennel | 264/461 |
| 6,177,213 B1 * | 1/2001 | Fetcenko et al. | 429/218.1 |
| 6,183,854 B1 | 2/2001 | Stiller et al. | 428/312.2 |
| 6,361,861 B1 | 3/2002 | Gao et al. | |
| 6,436,506 B1 | 8/2002 | Pinter et al. | |
| 6,737,160 B1 * | 5/2004 | Full et al. | 428/397 |
| 6,872,439 B1 * | 3/2005 | Fearing et al. | 428/99 |
| 2003/0203139 A1* | 10/2003 | Ren et al. | 428/34.3 |

OTHER PUBLICATIONS

Ren, et al., Synthesis of Large Arrays of Well-Aligned Carbon Nanotubes on Glass, SCIENCE, vol. 282, pp. 105-107, Nov. 6, 1988.

Huang, et al., Growth of Highly Oriented Carbon Nanotubes of Plasma-Enhanced Hot Filament Chemical Vapor Deposition, Applied Physics Letters, vol. 73, No. 6, pp. 3845-3847, Dec. 28, 1998.

Li, et al., Highly-ordered Carbon Nanotube Arrays for Electronics Applications, Applied Physics Letters, vol. 75, No. 3, pp. 367-369, Jul. 19, 1999.

* cited by examiner

DENDRITIC FIBER MATERIAL

CROSS REFERENCE TO RELATED APPLICATIONS

This application is a continuation of U.S. patent application Ser. No. 09/593,587, entitled Thermal Interface, filed on Jun. 13, 2000, now U.S. Pat. No. 6,913,075, which claims priority to U.S. Provisional Patent Application Ser. No. 60/139,443, entitled Thermal Interface, and filed on Jun. 14, 1999. The entire disclosures of both applications are hereby incorporated by reference in their entirety.

BACKGROUND OF THE INVENTION

1. Field of the Invention

The invention relates to heat transfer interfaces such as gaskets that provide a path for heat transfer between two surfaces.

2. Description of Related Art

Much of thermal management involves the transfer of heat from one element, such as electronic components, boards and boxes, heatpipes, radiators, heat spreaders, etc. to another. Of major concern in this process is the thermal contact resistance of the interface between the two components. While individual components might have very high conductance, large temperature drops ($\Delta T$'s) can develop at high resistance interfaces, limiting overall performance of the thermal control system. The entire thermal management system can be greatly improved by using thermal interfaces with lower resistance. Smaller $\Delta T$'s can result in weight reduction, better performance, and longer lifetimes of electronic elements (e.g. batteries).

Existing methods of thermal attachment include bonding (brazing, soldering, adhesives, tapes) or bolting/clamping, often with a filler such as a thermal gasket or grease. The ideal interface will fill the gaps between the two elements with high thermal conductivity material. It will be compliant so that only a minimal amount of pressure is required for intimate contact, precluding the need for heavy bolts or clamping mechanism, and eliminating the necessity of flat, smooth mating surfaces. Furthermore, it will not fail under stresses induced by thermal expansion mismatch.

Conventional thermal gaskets consist of small, roughly spherical particles (e.g. alumina, BN, Ag) suspended in a compliant polymeric media such as silicone. Although each particle has high thermal conductivity, the interface between the particles has low conductance. The effective $\kappa$ of the composite is limited by these numerous interfaces and the highest $\kappa$ achieved is of the order of only a few W/mK.

As an alternative to the above described thermal interface material such as thermal greases, arrays of substantially parallel carbon fibers has been used. Some example systems of this type are provided by U.S. Pat. Nos. 5,077,637 to Martorana et al., 5,224,030 and 5,316,080 to Banks et al., and 4,849,858 and 4,867,235 to Grapes et al. The disclosures of each of these five patents are hereby incorporated by reference herein in their entireties.

Although carbon fiber based gaskets have increased thermal conductance over many other alternatives, their promise has not been realized, and further improvements to the efficiency of heat transfer for these types of gaskets is needed.

SUMMARY OF THE INVENTION

In one embodiment, the invention comprises a thermal interface including a first surface, a second surface, and a plurality of elongate fibers in the space between and in contact with at least one of the first and second surfaces. At least some of the fibers have a cross sectional diameter of less than approximately 1 micron. In some specific embodiments, the fibers extend from one or both sides of a metal membrane. In another specific embodiment, the fibers having a cross sectional diameter of less than about 1 micron are bonded to a portion of other fibers having a cross sectional diameter of greater than approximately 3 microns.

In another embodiment of the invention, a method of transferring heat away from a heat source comprises transferring heat from the heat source to a first plurality of fibers having cross sectional diameters of less than about 1 micron, transferring heat from the first plurality of fibers to a second plurality of fibers having cross sectional diameters of more than about 3 microns, and transferring heat from the second plurality of fibers to a heat sink.

In yet another embodiment, a thermally conductive gasket comprises a plurality of fibers having first and second ends, the fibers being predominantly aligned such that the first ends are positioned adjacent to a first face of the gasket and such that the second ends are positioned adjacent to a second face of the gasket. A material is located predominantly proximate to the first ends, with the material improving heat transfer between the first ends and a device in contact with the first face. The material may comprise nanofibrils.

DETAILED DESCRIPTION

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

The inventions described herein relate to materials and associated devices that transfer heat from one device to another. A compliant thermal interface material developed by the applicant, which is presently marketed as VEL-THERM, is superior to existing commercial thermal interface gaskets. This material is a soft, carbon fiber velvet consisting of numerous high-κ (as high as 1000 W/mK) carbon fibers aligned perpendicularly to the interface plane. In some embodiments, such a "brush" of predominantly aligned carbon fibers is embedded in an adhesive substrate such that the tips of the fibers are attached to the surface of the substrate at one end, and are exposed at the other end. Free-standing "interleaf" gaskets can also be fabricated. These have fiber tips on both major surfaces, and the fibers are held together with an encapsulant such as a silicone or epoxy material.

Commercially available carbon fibers are formed from either pitch or PAN precursor material and drawn onto fiber tow. Each fiber typically has diameter ~10 μm, but which may vary between approximately 3 and 15 microns. Pitch fibers are graphitized by heating to high temperatures (near 3000° C.), giving them high thermal conductivities κ~1000 W/mK.

When placed between two surfaces, each fiber provides a high thermal conductivity path from one surface to the other. For uneven gaps, each fiber can bend independently in order to span the local gap. Low pressures are necessary to allow each fiber to touch both surfaces. Contact is maintained by either clamping or pressing the fiber tips into adhesive and bonding in place. By using high-κ fibers oriented in the direction of heat flow, such gaskets have a high κ (as high as 200 W/mK), while at the same time being even more compliant than conventional, particle-filled gaskets. Such velvet gaskets also work better than copper foil (at comparable pressures) because they provide a greater area of contact, conforming to uneven surfaces.

Many configurations are possible depending on the application requirements. Thus, the velvet can be bonded to one or both surfaces with various adhesives or PSA "tapes" including metal foils. The highest measured total thermal conductance has been achieved by a high-κ carbon fiber interleaf "gasket" in which the fibers are encapsulated in a silicone gel encapsulant.

The total thermal resistance of a thermal gasket interface is the sum of three contributions: the resistance of the bulk material itself, and the resistances of each interface where the material comes in contact with the interfacing surface. In terms of conductance (inverse of resistance) this may be written as:

$$h_{total}^{-1} = h_{bulk}^{-1} + h_{interface1}^{-1} + h_{interface2}^{-1}$$

In some embodiments, $h_{bulk} = \kappa_{bulk}/t = 400,000$ W/m²K, which is 40× higher than $h_{total}$. Thus, the total joint resistance is dominated by the contact resistance between the fiber tips and the contacting surfaces. Each interface has $h_{interface} \sim 20,000$ W/m²K. If the contact conductance is increased to values comparable to the bulk conductance, the total conductance of the interface can be dramatically improved.

To improve this contact conductance, some embodiments of the invention utilize very small diameter fibers having diameters less than about 1 micron either in conjunction with, or as an alternative to, the typically 3–15 micron diameter conventional carbon fibers. These small diameter fibers are referred to herein as nanofibrils or whiskers. Conventional carbon and silica whiskers may be utilized. Conventional carbon whiskers may be grown from a Ni or Fe catalyst by CVD processing. However, they have typically relatively large diameters of ~1 μm. Furthermore, in order for conventional carbon whiskers to have high κ, they must be graphitized by heating to ~3000° C.

In some advantageous embodiments of the invention, the whiskers comprise single or multi-walled carbon "nanotubes". A nanotube is a recently discovered form of carbon that is basically an elongated version of a $C_{60}$ molecule, also known as a Buckminster Fullerene, and commonly referred to as a "Buckyball". A single-walled nanotube consists of a rolled graphene sheet, forming a tube of diameter 1.4 μm, and capped at each end. Nanotubes display many interesting and useful properties including very high thermal conductivity and high stiffness. They are highly robust; they elastically buckle, rather than fracture or plastically deform, when bent to large angles. Multiwalled nanotubes, which have larger diameters of up to about 500 nanometers, can also be grown, with similar properties. These properties make both single and multi-walled nanotubes surprisingly useful as components of thermal interfaces. Their thermal conductivity provides excellent heat transfer characteristics, and their mechanical properties provide the capacity to form large areas of compliant contact with adjacent surfaces.

Figure 1A:
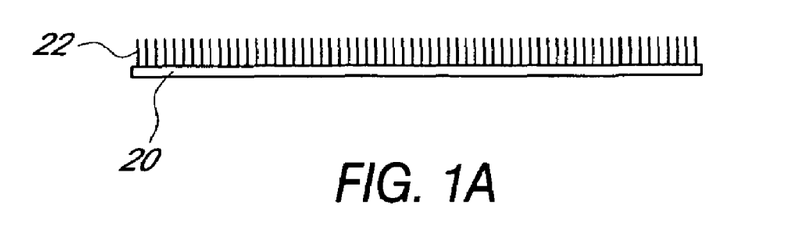
FIG. 1A is a side view of one embodiment of a thermally conductive gasket incorporating nanofibrils.
Figure 1B:
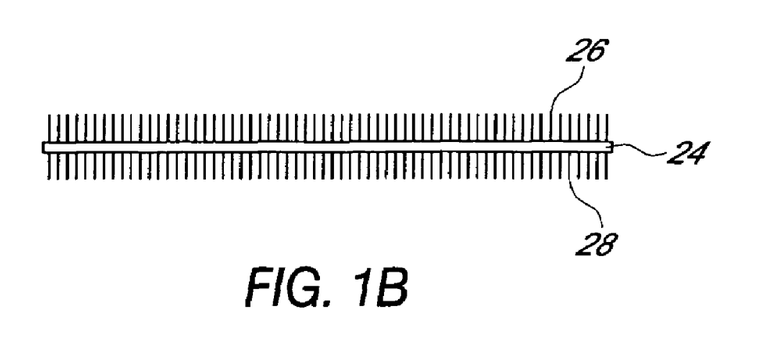
FIG. 1B is a side view of another embodiment of a thermally conductive gasket incorporating nanofibrils.

One embodiment of a thermal interface constructed in accordance with these principles is illustrated in FIGS. 1A and 1B. Referring now to FIG. 1A, the thermal interface comprises a base 20 which has extending therefrom an array of nanofibrils 22 having diameters of less than about 1 micron. FIG. 1B illustrates a two sided nanofibril gasket. In this embodiment, the base 24 forms a central support, nanofibrils 26, 28 extend in opposite directions from both major surfaces. The central support 24 or base 20 may, for example, be about 1 to 20 or mils thick, depending on the desired mechanical properties.

Several methods of growing arrays of nanofibrils/whiskers on substrate surfaces are known in the art. Chemical vapor deposition techniques have been used to grow relatively aligned nanotubes on nickel and nickel coated glass substrates as reported in Ren, et al., *Science*, Volume 282, pages 1105–1107 (Nov. 6, 1998) and in Huang et al., *Applied Physics Letters*, Volume 73, Number 26, pages 3845–3847 (Dec. 28, 1998), the disclosures of which are hereby incorporated by reference in their entireties. Ren et al. used a plasma-enhanced chemical vapor deposition (PECVD) process in which the nanotubes grew from a nickel film catalyst in the presence of acetylene ($C_2H_2$), ammonia ($NH_3$), and nitrogen ($N_2$) at temperatures less than 666° C. Multiwalled nanotubes with diameters from 20–400 nm and lengths from 0.1–50 μm were obtained. Thicker Ni films resulted in larger diameter nanotubes. Transmission electron microscopy (TEM) images showed that the nanotubes were multiwalled, centrally hollow tubes, not solid fiber. Each wall is presumed to be a highly thermally conductive graphitic layer. Key to their success seems to be the introduction of ammonia, which Ren et al. conjectured participated with the nickel in the catalytic reaction. The plasma enables growth at lower temperatures. The electric field of the plasma may also play a role in forming the nanotube array.

In one advantageous embodiment, the base 20 or membrane 24 is aluminum, and the arrays of nanofibrils are created by forming a film of porous alumina on the aluminum substrate, growing nanotubes within the pores of the alumina film, and then etching away the alumina. This method is described in detail in J. Li et al., *Physical Review Letters*, Volume 75, Number 3 (Jul. 19, 1999), the disclosure of which is hereby incorporated by reference in its entirety. With this method, a hexagonally ordered array of substantially axially aligned carbon multi-walled nanotubes on aluminum is fabricated using a hexagonal "nanochannel alumina" (NCA) membrane as a template. The template is formed on pure aluminum by anodization and consists of alumina with long, cylindrical pores with diameters from 10–500 nm diameter and lengths that span the thickness of the "membrane". Cobalt catalyst "nanoseeds" are deposited in the bottom of each pore by electrodeposition. Multi-walled nanotubes are then grown in each of the pores by hot-wall CVD at 650° C. (just below the melting point of Al). The alumina is then etched away, leaving an array of multiwalled nanotubes on an aluminum substrate. Double sided thermal gaskets as shown in FIG. 1B may be created by forming the alumina template on both sides of an aluminum sheet, and growing nanotubes on both sides. Alternatively, a thick porous alumina membrane may comprise the support.

Outstanding features of this array are (1) uniformity of nanotube diameters, (2) near perfect alignment perpendicular to the substrate, (3) regularly spaced nanotubes in a highly ordered hexagonal lattice, (4) uniformity of nanotube lengths. Furthermore, this technique allows independent control of the nanotube diameter, length, and packing fraction. The fabrication technique has advantages over others. It eliminates the need to use a plasma, hot filament, and photolithography, involving only wet chemistry and hot-wall CVD. It can be scaled up for large areas. Furthermore, the parameters are in the proper range for application as a thermal interface, with the nanotubes being about 10–500 nanometers is diameter, a 50% packing fraction, and lengths from 1–100 microns.

In another embodiment, nanofibrils (or whiskers) are placed in contact with one or both ends of at least some of the fibers of an array of predominantly aligned larger diameter carbon fibers. In this embodiment, rather than enhancing the thermal interface performance of a foil by adding nanofibrils to one or both surfaces of a foil membrane, the performance of a carbon fiber brush/velvet which is formed from a predominantly aligned array of 3–15 micron diameter fibers is enhanced by the addition of nanofibrils to the tip region of the larger diameter fibers.

An analysis of heat transfer in the tip region of a carbon fiber gasket illustrates the importance of this region to the overall heat transfer efficiency. For small temperature differences, radiation exchange can be neglected. When the contact area is small compared to the contacting bodies, there is an extra "constriction resistance" due to bottlenecking of the heat flow through the constriction, given by:

$$R_{constriction} \sim 1/(4\kappa a)$$

where $\kappa$ is the harmonic mean of the contacting materials: $\kappa^{-1} = \kappa_1^{-1} + \kappa_2^{-1}$, and a is the diameter of the contact area (taken to be circular). For small a, which depends on applied pressure, material hardness, tip geometry, and surface roughness, this resistance can be quite large. A conducting whisker array on the fiber tip removes the heat flow bottleneck, greatly alleviating the constriction resistance.

Attaching whiskers to the fiber tips improves thermal conductance of the gasket for several reasons. In applications where the interface is in a vacuum, the whiskers at the fiber tip will reduce the constriction resistance of the fiber contact point. In a vacuum, heat is conducted through the physical contact area between the fiber tips and the contacting surface, which is often only a small fraction of the fiber cross sectional area. The contact pressure P is low compared to the hardness H of the contacting materials ($P \ll 10^{-4}$ H), which therefore do not deform very much. In addition, the fiber tip is not flat, being highly irregular in shape.

In the presence of air or other fluid surrounding medium, and at low contact pressures ($P < 10^{-4}$H), heat is mostly conducted through the fluid-filled gap; that is, the solid spot conduction is small compared to conduction through the fluid. Furthermore, convective heat transfer in air is usually negligible for gap widths less than ~6 mm. For an irregularly-shaped fiber tip, the average gap $\delta$ between the bottom of the fiber and the contacting surface is of the order of the fiber radius (5 microns). Assuming conditions are such that the mean free path is small (~0.3 microns for air at STP) compared to $\delta$, we may use Fourier's law of heat conduction. The conductance through the bottom of the fiber is then $q/\Delta T = \kappa \delta$.

The thermal conductance through a medium of conductivity $\kappa$ between an isothermal flat surface and an isothermal vertical cylinder of length L and diameter D may be approximated as:

$$q/\Delta T = \kappa \frac{2\pi L}{\ln(4L/D)}, \quad \text{if } D/L \ll 1.$$

We take the effective length to be about the average interfiber distance $L \sim D \phi^{-1/2}$, where $\phi$ is the fiber packing fraction. The total thermal conductance per unit area of one of the interfaces of a velvet is then approximated as:

$$h_{interface} = \frac{2\kappa\phi}{D}\left(1 + \frac{4L/D}{\ln(4L/D)}\right) \sim \frac{2\kappa\phi}{D}\left(1 + \frac{4\phi^{-1/2}}{\ln(4\phi^{-1/2})}\right)$$

The second term dominates; that is, most of the heat conducts from the sides of the fiber near the tip through the conducting medium to the flat surface. For $\phi=20\%$, $h_{interface} \sim 12\phi\kappa/D \sim 6000$ W/m²K for air ($\kappa=0.025$ W/mK) and ~24,000 W/m²K for silicone encapsulant ($\kappa=0.1$ W/mK).

Thus, a fiber tip enhanced with a nanofibril or whisker array would fill the gap with a medium with a higher effective $\kappa$, thereby improving $h_{interface}$. This may be accomplished in a variety of ways. In one embodiment, an unaligned discontinuous powder of nanofibrils is used to coat the tip region of the large fiber velvet. These powders are commercially available as, for example, type Pyrograf III whiskers from Applied Sciences, Inc. This material is a powder of cut whiskers with diameters of about 50–300 nanometers and lengths of about 20 to 80 microns. The nanofibril powder may be used as filler for thermally conductive grease, for example, which is applied to the tips of the velvet fibers. Alternatively, the powder is placed directly on the tips by soaking them in a solution of Pyrograf III in ethanol. The solution is advantageously ultrasonically vibrated to better disperse and disentagle the whiskers. After application, the presence of the nanofibrils in the tip region of the larger fibers improves heat transfer at the interface between the larger fiber tips and the surface of the component the tips are in contact with.

Figure 2:
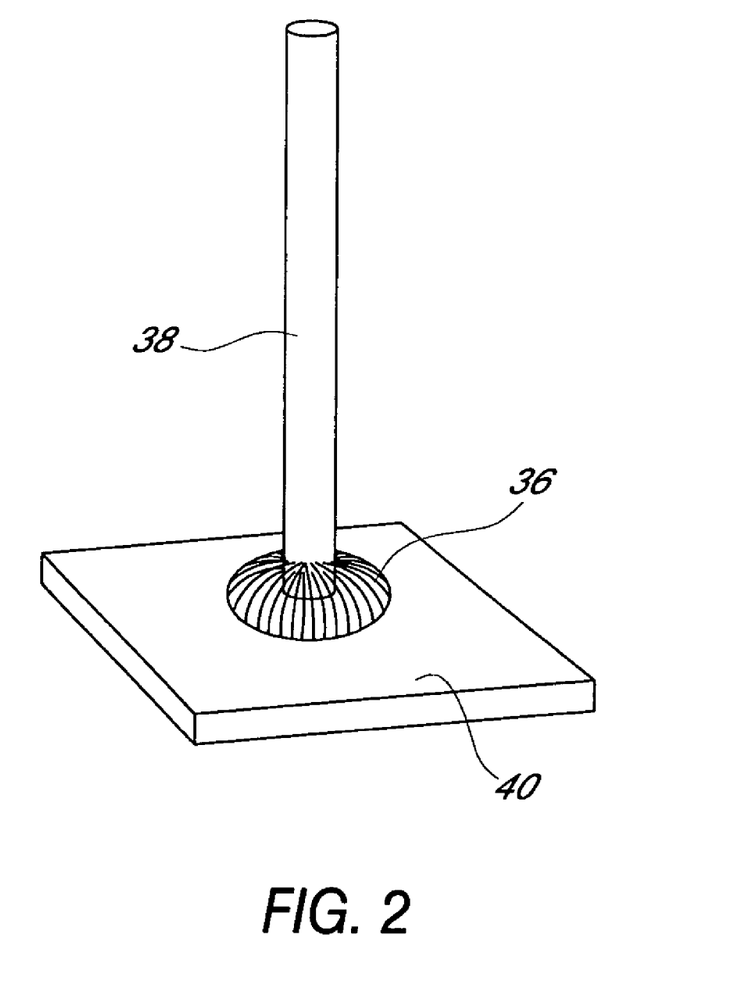
FIG. 2 is a perspective view of a carbon fiber having a nanofibrils attached to the tip.

Because the nanofibril powder is not an aligned array of nanofibrils, there are many inter fibril interfaces which still interfere with efficient heat transfer. Thermal conductance will be improved further if the nanofibrils formed a more ordered array with the nanofibrils spanning the gap between the tip of the larger diameter fiber and the component surface from end to end. This is shown conceptually in FIG. 2. As shown in this Figure, a mop of nanofibrils 36 is attached to the tip portion of a larger diameter fiber 38. The nanofibrils 36 preferably extend predominantly away from the larger diameter fiber 38 and toward the component surface 40. In this embodiment, the nanofibrils may be configured to span the gap between each fiber and the mating surface, forming a high conductivity ($\kappa$~200 W/mK), soft mop that effectively thermally shorts out the resistive gap. Although heat transfer efficiency between the tip of the larger fiber 38 and the component surface 40, may be expected to be better with better nanofibril alignment, even relatively poorly aligned masses of nanofibrils may be used to improve fiber tip heat transfer performance.

In one set of gasket fabrication procedures performed by the inventors, nanofibrils were formed onto larger diameter fibers and fiber velvets. In these procedures a CVD apparatus comprising a stainless steel (SS) vacuum chamber was utilized. In this chamber, a controlled gas mixture of ammonia and hydrocarbon (propylene or acetylene) flows down through a SS tube from the top, fills the chamber, and is pumped from the bottom with a mechanical pump. The gas flow is controlled and monitored with MKS mass flow controllers. The pressure is controlled by a needle valve above the pump and monitored with a MKS Baratron gauge. A quartz window allows visual monitoring of the experiment.

The plasma is sustained between two 2"-diameter, graphite electrodes. The bottom electrode is mounted on a ceramic (mullite) tube. A SS-sheathed thermocouple runs up the inside of the tube in order to monitor the temperature of the bottom electrode. The top electrode is mounted to the SS gas inlet tube; its height can be adjusted to control the gap. The bottom electrode (anode) is grounded through the thermocouple sheath. The top electrode (cathode) is electrically isolated from the chamber and carries the (negative) high voltage, powered by a 1 kW DC power supply capable of 1000V/1A.

A hot filament is used for three purposes: (1) thermal nonequilibrium heating of the sample (2) emission of electrons to stabilize the glow discharge and prevent arcing (3) cracking of the hydrocarbon gas. Tungsten wire, 15 mil diameter, is wound into a coil and mounted between the electrodes. The support and electrical connections are made through an electrical feedthrough in the back. The filament is powered through an isolation transformer at 60 Hz. In the later CVD runs, the W coil was prevented from "drooping" when heated by supporting the coil with an alumina tube running through it, thus allowing better control of its position. Typical power applied through the coil was 200 W.

In a typical procedure, the sample, including substrate and catalyst coating, is placed on the bottom electrode. The chamber is sealed and leak tested with a He leak detector with a mass spectrometer. A gas flow of 160 sccm ammonia is established with a pressure of a few torr. An ammonia plasma is initiated between the electrodes and the tungsten filament is heated to ~1500° C., as monitored by an optical pyrometer. The filament radiatively heats the sample. The temperature of the anode is monitored, although the sample is hotter than this. The sample is heated and etched for 10–15 mins. Then 80 sccm of hydrocarbon gas (propylene or acetylene) is introduced to start the CVD deposition, i.e. growth of carbon nanofibrils. After ~5 mins, the deposition is ceased and the chamber allowed to cool, after which the sample is removed and examined.

Figure 3A:
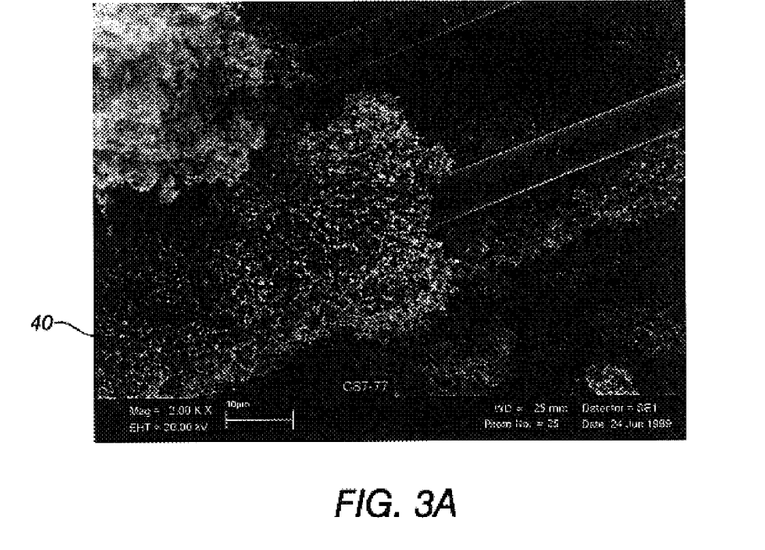
FIG. 3A is a scanning electron microscope image of a 7 micron diameter fiber with a mop of nanofibrils attached to the tip.
Figure 3B:
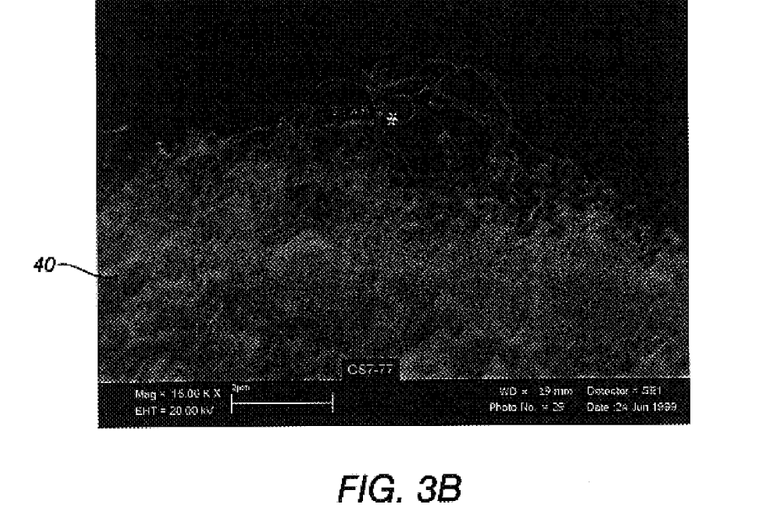
FIG. 3B is an increased magnification of the fiber of FIG. 3A.

Dozens of PE-HF CVD runs have been performed using the techniques described by Ren et al. and Huang et al. set forth above using a number of substrates including commercially available nickel coated carbon fibers, as well as nickel coated pitch and PAN carbon fiber velvet gaskets. FIGS. 3A and 3B illustrate nanofibril "mops" 40 grown onto nickel coated 7 micron diameter carbon fibers. These nanofibrils appear to be similar in structure to commercial vapor grown carbon fibers comprising tubes of concentric, graphitic layers. However, they tend to have a high defect density, exemplified by their not being straight, and causing them to have a lower thermal conductivity than ideal. The $\kappa$ of these nanofibrils has not been measured, but they are most likely graphitizable, and if necessary, heat treatment at 2800° C. would likely give them a $\kappa$ of ~2000 W/mK.

Figure 4:
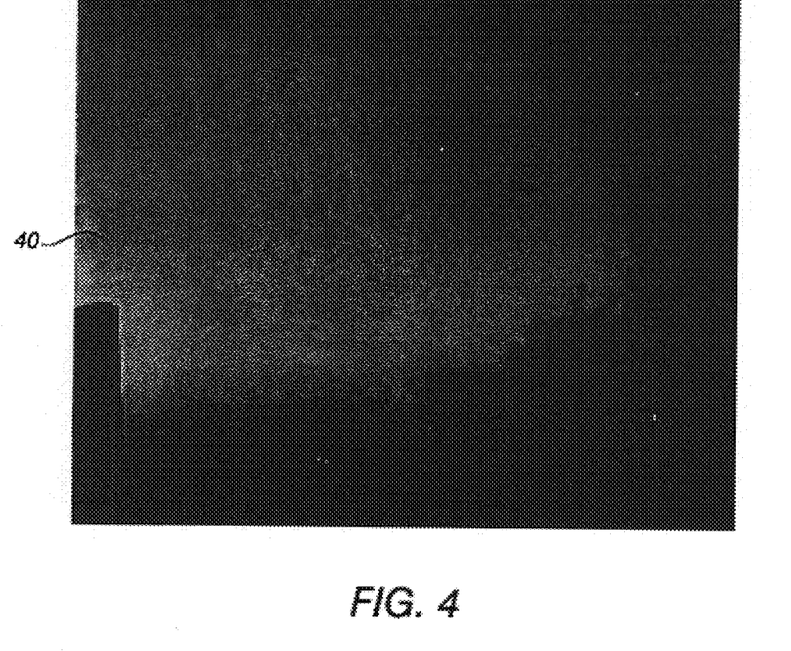
FIG. 4 is a scanning electron microscope image of a mop of nanofibrils which has been mechanically compressed.

Under an optical microscope, one of the "befuzzed" fibers was singled out for investigating how the nanotube mop responds to pressure exerted by a surface with which it comes into contact. The befuzzed fiber tip was contacted with flat-bladed tweezers with enough force to bend the fiber, as observed under the optical microscope. The sample was then placed in the SEM to examine the effect. Shown in FIG. 4 is an SEM image of the pressed befuzzed fiber tip. Although the diameter of the fiber is only 7 μm, the diameter of the befuzzed fiber is approximately 40 μm. Although a bit flattened, the mop can still be seen around the fiber tip, indicating some degree of mechanical resilience.

In another set of fabrication procedures, high thermal conductivity gaskets were made out of high-$\kappa$ (~1000 W/mK), pitch carbon fibers (~10 micron diameter), The fibers are preferentially aligned in the z-direction such that each fiber spans the entire thickness of 1 mm. The fibers are held together with a light, epoxy wash coat. Capillary forces cause the epoxy to collect at the nodes where fibers contact each other. The packing fraction of fibers is about 10%, which implies a theoretical bulk thermal conductivity value of $\kappa$~100 W/mK and a bulk conductance of h~100,000 W/m$^2$K.

Gaskets of a high-$\kappa$ velvet (100 W/mK) attached to a POCO carbon substrate may be made by electroflocking high-$\kappa$ (generally about 100–1000 W/mK) pitch fibers (for example, 10 micron diameter×0.5 mm length) into high-$\kappa$ (~2 W/mK) carbonizable polymer such as polyimide. Electroflocking is a known technique for forming aligned fiber arrays. Pneumatic or mechanical flocking techniques may also be used. A variety of carbon fiber types may also be utilized, such as are commercially available from Amoco Corp. or Toray. A nickel film is ion beam sputtered into the velvet, most notably on the fiber tips. Carbon whisker arrays are then grown on the nickel coated fibers via PECVD processing.

The carbon fibers are precision cut from a continuous spool. Although the mean length of the pitch fibers will be controlled (typically 0.5 mm), there is some variation in length of 50 micron or more, which is comparable to the average distance between adjacent fibers. A few psi pressure is required to bend the longer fibers so that the tips of the shorter fibers contact the interfacing surface. In some embodiments, the velvet samples may be lapped and polished before deposition of the Ni film so that the fiber tips are more coplanar (within a few microns). This can be accomplished by EDM cutting or by potting the velvet in a removable medium and then lapping and polishing it flat. The potting medium is then removed.

Coplanar tips may allow the "whiskerized" velvets to have high conductivity using less than 1 psi pressure since there is no need to compress the velvet in order for all of the tips to contact the interfacing surface. Coplanar tips may also have an effect on the quality or uniformity of the whisker arrays on the tips.

In one specific process, six gaskets were potted in a removable polymer and lapped on both sides with fine sandpaper (600 grit). The potting medium was then removed. These gaskets were processed in a carbon CVD reactor in order to carbonize the epoxy wash coat and deposit a thin carbon CVD layer (~2 micron-thick) that would hold the fibers together. The resulting gaskets are then able to withstand the PE-HF CVD process. A 55±5 nm-thick film of Ni catalyst was ion-beam sputtered onto both sides of four of the carbon CVD'ed gaskets.

EXAMPLE

Pitch carbon fiber gasket sample cs7-144 was processed in the PE-HF CVD reactor under the conditions listed in Table 1

TABLE 1

PE-HF CVD deposition conditions of pitch fiber gasket sample

| Sample# | cs7-144 |
|---|---|
| Mounting conditions | Lying flat on anode |
| Plasma power | 160 W |
| HF power | 300 W |
| Max temperature | 527° C. |
| Plasma etch time | 12 min |
| Deposition time | 5 min |
| Hydrocarbon gas | Acetylene |
| Mass gain | 4.6 mg (5%) |
| Resulting deposit | Heavy, bottom side |

After the chamber cooled, the sample was removed and examined under the microscope. The bottom of Sample cs7-144 was covered with carbon deposit that was visible under the optical microscope. The 90.5 mg sample had gained 4.6 mg, which corresponds to a 4 micron-thick, uniform layer of carbon over one surface. Some areas displayed thicker deposits than others. The variation may reflect variation in local temperature, hydrocarbon concentration, and/or catalyst microstructure.

Figure 5:
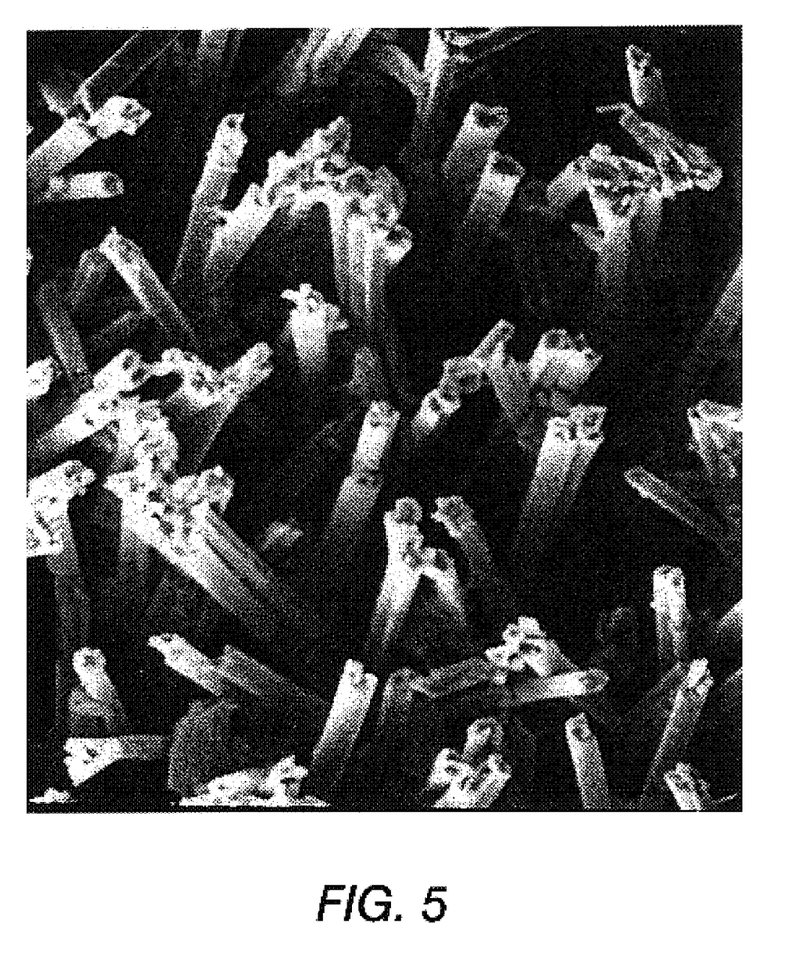
FIG. 5 is a scanning electron microscope image of the tips of the fibers of a thermal gasket prior to the deposition of nanofibrils.
Figure 6A:
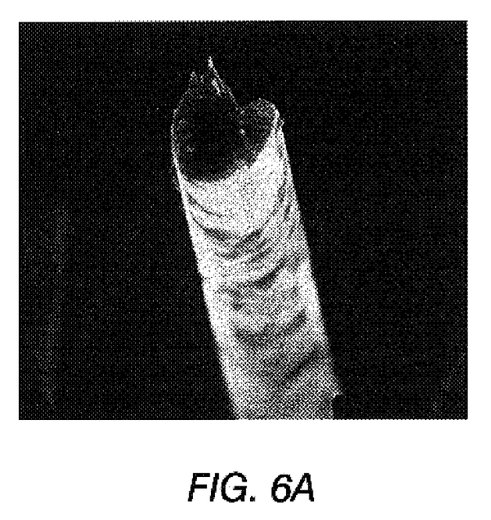
FIG. 6A is a scanning electron microscope image the tip of one fiber of the gasket of FIG. 5 after lapping.
Figure 6B:
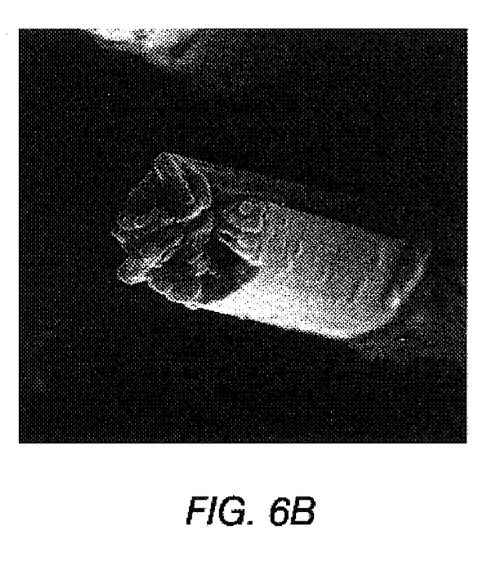
FIG. 6B is a scanning electron microscope image the tip of one fiber of the gasket of FIG. 5 after lapping and carbon CVD deposition.
Figure 6C:
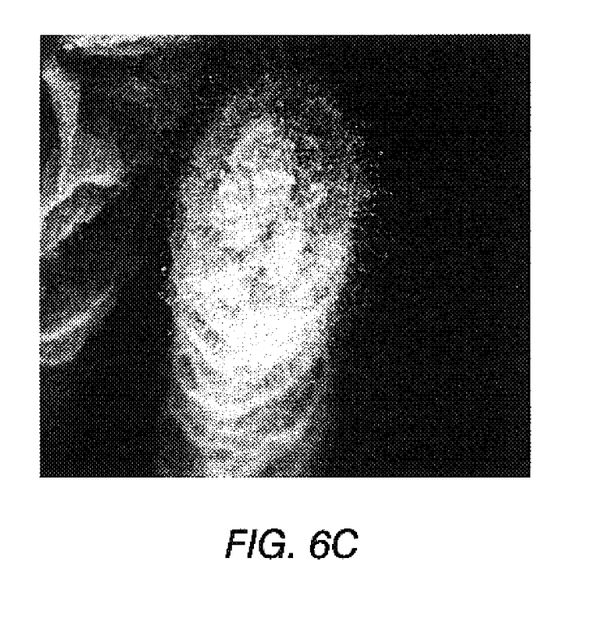
FIG. 6C is a scanning electron microscope image the tip of one fiber of the gasket of FIG. 5 after lapping, carbon CVD deposition, and nanofibril deposition.
Figure 6D:
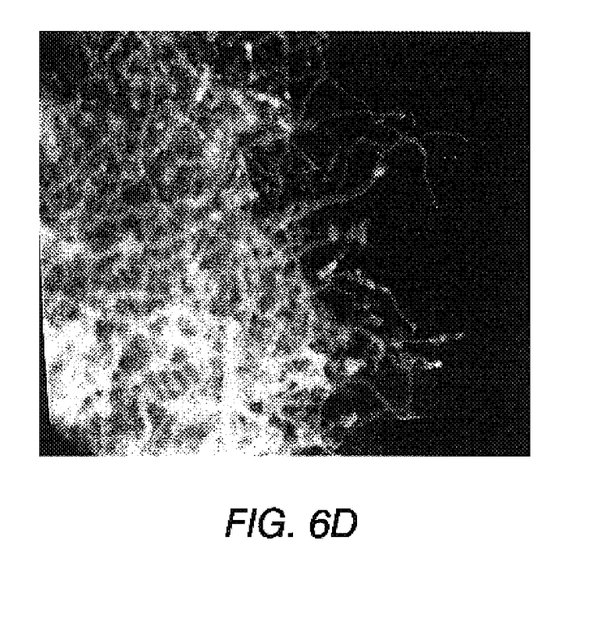
FIG. 6D is a higher magnification of the nanofibril mop of FIG. 6C.

FIG. 5 is a 250× SEM image of a pitch carbon fiber gasket, looking from above, prior to the deposit of nanofibrils to the larger diameter fibers. The preferential alignment of the fibers is evident. FIGS. 6A–6C show the tip of a single pitch fiber of Sample cs7-144 after various processing steps, FIG. 6A after lapping, FIG. 6B after carbon CVD, and FIG. 6C after PE-HF CVD. Many of the pitch fibers form a "pac-man"-shaped cross section during their manufacture. The fibers are remarkably flat after lapping. The carbon CVD deposited a uniform layer of ~2 μm of carbon, increasing the diameter of each fiber from ~12 μm to ~16 μm. It also formed a nodular structure at the tip which is no longer flat. In FIG. 6C, it is seen that the PE-HF CVD did indeed deposit an array of carbon nanofibrils on the tips and along the shafts of the fibers. FIG. 6D shows an ×10 k view of the nanofibrils. They are not straight, but form a "mop" which appears to be highly packed. The nanofibril diameters are on the order of 100 nm.

Another means of enhancing the conductance at the tips is to add phase change material (PCM) at and around the tips. Thermally-conductive PCM is commercially available from several vendors. It is typically sold in sheet form with thicknesses from 1 to several mils. It consists of a wax (high molecular weight hydrocarbon), filled with thermally conductive solid particles such as BN, alumina, diamond, silver flake, etc. As described above with reference to thermal grease, the phase change material may also include cut carbon nanofibrils. These particles typically have characteristic sizes from 1 to several microns. In addition, there may be wetting agents added so that the wax wets the particles, as well as the tips of the fibers.

Useful PCM is a solid at room temperature, and softens and melts at elevated temperatures. It may or may not be molten at operating temperatures. The PCM sheet is typically supported by release liner paper that is eventually peeled away before application. In some advantageous embodiments, the melting point of the material is between about 30 degrees C. and 100 degrees C. In some cases, the melting point is between about 40 degrees C. and 70 degree C.

The PCM can be added to the fiber tips by a number of methods. The fibers can be flocked into a sheet of PCM that is heated to just the right temperature so that the tips of the flocked fibers adhere to it and remain vertically oriented. The fibers can then be anchored to the PCM sheet by melting the PCM further and/or pushing the fiber tips further into the PCM. The resulting velvet may or may not then be partially encapsulated with silicone gel, PCM, acrylic spray, foam, or other means of encapsulation. The purpose of encapsulation is to (1) hold the fibers together, providing structural support, and (2) preventing fibers from escaping as potentially harmful debris. The latter is of special concern if the fibers are electrically conductive. Next, a PCM sheet can by placed on top of the resulting velvet, and the entire PCM/velvet/PCM sandwich pressed together and/or heated to fuse everything together.

This material has several advantages over the use of thermal grease and elastomer potted velvets. Similar to grease, high thermal conductivity PCM improves interface conductance. However, the PCM may be localized preferentially near the tips. This makes gasket very compliant, unlike velvet that is totally filled with elastomer. Furthermore, solid PCM is not messy at room temperature like thermal grease, it supports velvet at room temperature when in solid form, and PCM acts as an adhesive that prevents fibers from escaping as debris.

In accordance with the above, thermal interface gaskets that have overall thermal conductance higher than commercially available gaskets may be produced. These gaskets may also be ultra compliant, able to conform to non-flat or rough surfaces with a minimal amount of applied pressure.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A composite material comprising: a base, a first fiber in contact with the base and having a cross sectional diameter of greater than about 3 microns, and a plurality of elongated second fibers having a cross sectional diameter of less than approximately 1 micron; wherein the plurality of second fibers is predominately in contact with the distal end of the first fiber.

2. The composite material of claim 1, wherein said plurality of elongated second fibers is bonded to the distal end of said first fiber.

3. The composite material of claim 2, wherein said end comprises the tips.

4. The composite material of claim 1, wherein at least some of said plurality of elongated second fibers comprises multi-walled nanotubes.

5. The composite material of claim 4, wherein said multi-walled nanotubes are hollow.

6. The composite material of claim 5, wherein said multi-walled nanotubes and said first fiber both comprise carbon.

7. The composite material of claim 6, wherein said first fiber is nickel coated.

8. A composite material comprising: a base, a first plurality of fibers having first and second ends, said second ends being in contact with said base, and said fibers being predominantly aligned and forming a sheet that extends in a direction substantially parallel to the base fibers; wherein substantially all of said plurality of fibers have a diameter of about 15 microns or less, and a carbon fiber material comprising a collection of carbon fibers located predominantly proximate to said first end of at least some of said first plurality of fibers; said collection of carbon fibers on each end having an overall diameter substantially greater than a diameter of the first end to which they are attached; said carbon fiber material forming a pliable contact surface being substantially parallel with said first end; said pliable contact surface having a higher degree of mechanical resilience than the plurality of fibers in response to application of an external load.

9. The composite material of claim 8, wherein said plurality of fibers have a diameter of more than about 3 microns, and wherein said carbon fiber material comprises a plurality of nanofibrils having a diameter of less than about 1 micron.

10. The composite material of claim 8, wherein said plurality of fibers have a diameter of more than about 3 microns, and wherein said carbon fiber material comprises an unaligned discontinuous powder of nanofibrils with diameters of about 50–300 nanometers and lengths of about 20 to 80 microns.

11. The composite material of claim 9, wherein said plurality of fibers comprise carbon.

12. The composite material of claim 11, wherein said plurality of fibers is nickel coated.

13. A composite material comprising: a plurality of fibers having first and second ends; said fibers being predominantly aligned and having a diameter of more than about 3 microns, and a carbon fiber material located predominantly proximate to said first end and comprising an unaligned discontinuous powder of nanofibrils with diameters of about 50–300 nanometers and lengths of about 20 to 80 microns; said carbon fiber material forming a pliable contact surface being substantially parallel with said first end.

* * * * *